US011252002B2

(12) United States Patent
Sahlin et al.

(10) Patent No.: US 11,252,002 B2
(45) Date of Patent: Feb. 15, 2022

(54) REFERENCE SIGNAL CONSTRUCTION

(71) Applicant: Telefonaktiebolaget LM Ericsson (publ), Stockholm (SE)

(72) Inventors: Henrik Sahlin, Mölnlycke (SE); Ansuman Adhikary, Hyderabad (IN); Johan Axnäs, Solna (SE); Robert Baldemair, Solna (SE); Andres Reial, Malmö (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 16/467,288

(22) PCT Filed: Dec. 19, 2016

(86) PCT No.: PCT/EP2016/081718
§ 371 (c)(1),
(2) Date: Jun. 6, 2019

(87) PCT Pub. No.: WO2018/113901
PCT Pub. Date: Jun. 28, 2018

(65) Prior Publication Data
US 2019/0312765 A1     Oct. 10, 2019

(51) Int. Cl.
*H04J 11/00* (2006.01)
*H04L 27/26* (2006.01)
*H04L 1/00* (2006.01)
*H04L 5/00* (2006.01)
(Continued)

(52) U.S. Cl.
CPC ...... *H04L 27/2613* (2013.01); *H04J 11/0073* (2013.01); *H04J 11/0076* (2013.01); *H04J 13/0014* (2013.01); *H04L 1/0045* (2013.01); *H04L 1/0057* (2013.01); *H04L 1/0072* (2013.01); *H04L 5/005* (2013.01);
(Continued)

(58) Field of Classification Search
None
See application file for complete search history.

(56) References Cited

U.S. PATENT DOCUMENTS

| 6,567,482 B1 * | 5/2003 | Popovic' | H04B 1/7093 |
| | | | 375/343 |
| 2004/0109405 A1 * | 6/2004 | Suh | H04L 27/2613 |
| | | | 370/208 |

(Continued)

FOREIGN PATENT DOCUMENTS

| CN | 106063339 A | 10/2016 |
| WO | 2009048907 A1 | 4/2009 |

OTHER PUBLICATIONS

International Search Report and Written Opinion dated Aug. 29, 2017 for International Application No. PCT/EP2016/081718 filed on Dec. 19, 2016, consisting of 11-pages.
(Continued)

*Primary Examiner* — Ajit Patel
(74) *Attorney, Agent, or Firm* — Christopher & Weisberg, P.A.

(57) ABSTRACT

There is disclosed a radio node for a wireless communication network, the radio node being adapted for processing reference signaling based on a coding, the coding being based on a Golay sequence. The disclosure also pertains to related devices and methods.

20 Claims, 19 Drawing Sheets

(51) Int. Cl.
*H04J 13/00* (2011.01)
*H03M 13/15* (2006.01)

(52) U.S. Cl.
CPC ....... *H04L 27/261* (2013.01); *H03M 13/1505* (2013.01); *H04L 5/0053* (2013.01)

(56) References Cited

U.S. PATENT DOCUMENTS

| | | | |
|---|---|---|---|
| 2005/0013381 A1* | 1/2005 | Suh | H04L 25/0204 375/260 |
| 2007/0113159 A1* | 5/2007 | Lakkis | H03M 13/611 714/783 |
| 2009/0122839 A1* | 5/2009 | Luo | H04J 11/0069 375/145 |
| 2010/0310009 A1 | 12/2010 | Lakkis | |
| 2011/0002430 A1* | 1/2011 | Kim | H04B 1/7083 375/362 |
| 2013/0259013 A1 | 10/2013 | Malladi et al. | |
| 2014/0293988 A1* | 10/2014 | Han | H04L 25/03305 370/344 |
| 2016/0087829 A1 | 3/2016 | Jia et al. | |
| 2016/0261319 A1 | 9/2016 | Sanderovich | |
| 2017/0033949 A1* | 2/2017 | Eitan | H04L 25/0232 |

OTHER PUBLICATIONS

3GPP TSG RAN NB-IoT Ad-Hoc R1-160115; Title: Synchronization signal design for NB-IoT; Agenda Item: 2.1.1.4; Source: LG Electronics; Document for: Discussion and decision; Location and Date: Budapest, Hungary Jan. 18-20, 2016, consisting of 7-pages.

Chinese Office Action with English Summary Translation dated Jul. 28, 2021 for Chinese Patent Application No. 201680091687.1 consisting of 9-pages.

EPO Communication dated Jul. 19, 2021 for Patent Application No. 16815848.3, consisting of 7-pages.

* cited by examiner

REFERENCE SIGNAL CONSTRUCTION

CROSS-REFERENCE TO RELATED APPLICATIONS

This application is a Submission Under 35 U.S.C. § 371 for U.S. National Stage Patent Application of International Application Number: PCT/EP2016/081718, filed Dec. 19, 2016 entitled "REFERENCE SIGNAL CONSTRUCTION BASED ON A GOLAY SEQUENCE," the entirety of which is incorporated herein by reference.

TECHNICAL FIELD

The present disclosure pertains to wireless communication technology, in particular in the context of reference signaling.

BACKGROUND

In modern wireless communication systems, different kinds of reference signaling are utilised, e.g. synchronisation signaling, demodulation signaling, etc. Such reference signaling may cover a large frequency range (bandwidth), and may have to be provided under heavy load conditions. Due to its importance for facilitating efficient communication, reference signaling should be easy to identify and in particular should have good interference characteristics and/or be easy to identify.

SUMMARY

It is an object of the present disclosure to provide approaches facilitating improved reference signaling.

Accordingly, there is disclosed a radio node for a wireless communication network. The radio node is adapted for processing reference signaling based on a coding, the coding being based on a Golay sequence. A Golay sequence has good autocorrelation characteristics, allowing reliable identification of reference signaling. The radio node may comprise processing circuitry and/or radio circuitry for processing reference signaling. It may be considered that the radio node comprises a processing module for the processing. The processing module may be implemented in and/or utilising processing circuitry and/or radio circuitry.

There is also disclosed a method for operating a radio node in a wireless communication network, the method comprising processing reference signaling based on a coding, the coding being based on a Golay sequence. The radio node may in particular be the radio node described herein.

A Golay sequence may comprise a number N of elements. A Golay sequence may be a sequence chosen out of a pair of complementary Golay sequences. A pair of sequences may have the same number N of elements and follow the correlation conditions discussed herein. It may be considered that a Golay sequence represents a bipolar sequence (e.g., elements may have values +1 or −1). A sequence may generally comprise a number (e.g., N) of numbered elements, e.g. a(0) . . . a(N−1). N may be 64 or larger, and/or in particular be a multitude of 2, and/or represent a power of 2.

The coding may generally be based on a pair of complementary Golay sequences, e.g. comprising a first sequence and a second sequence. The correlation characteristics of such a pair are particularly suitable to be used in the context of reference signaling, e.g. reference signaling comprising two components (e.g., covering two different frequency intervals). It may be considered that the coding maps (and/or multiplex) a first component of the reference signaling to a frequency interval, and a second component of the reference signaling to the (same) frequency interval, in particular to different frequency resources within the interval. A component of reference signaling may comprise signaling, signals and/or symbols transmitted in the same time interval, e.g. subframe and/or TTI and/or similar. In some cases, a first component may represent primary synchronisation signaling, and a second component may represent secondary synchronisation signaling.

Generally, the coding may map first reference signaling to a first frequency range and a second reference signaling to a second frequency range. In particular, the coding may comprise and/or represent a map and/or function or relation providing such mapping. The first and second frequency ranges may be frequency intervals, which may be non-overlapping and/or neighboring (e.g., sharing a border frequency). Each frequency range may in particular represent a carrier, the first and second ranges may represent different carriers. The first reference signaling may be different reference signaling from the second reference signaling, e.g., the first reference signaling may represent primary reference signaling and the second reference signaling may represent secondary reference signaling. Alternatively, the first reference signaling may represent a first component and the second reference signaling a second component of one type of reference signaling.

The elements of a Golay sequence and/or the coding (and/or resources mapped to) may be determined differentially. Differentially determining an element may be such that one or more elements after the first element of a sequence is or are determined based on one or more preceding element/s. Determining may be performed by the radio node, which may comprise a corresponding determining module and/or processing circuitry. Determining may be based on identifying a first element in received signaling, and determining following elements differentially. A first element may be identified based on a received element indication, which may represent and/or indicate the first element. Differentially determining may be based on a differential mapping, which may be indicated by the element indication. The differential mapping may be available to the radio node, e.g. a memory of the radio node. Processing, in particular transmitting, reference signaling, may comprise transmitting the element indication, e.g. in the reference signaling and/or in a separate message or signal, e.g. in a broadcast or dedicated signal or message (e.g., addressed to one or more specific user equipments or terminals). In particular, the element indication may be transmitted using control signaling. Alternatively or additionally, e.g. based on the determined elements, decoding and/or encoding may be determined, e.g. differentially. Determining a signaling sequence and/or a Golay sequence, e.g. differentially determining the Golay sequence, may comprise pruning (truncating a number N of elements to a number K<N) and/or zero padding (increasing the number of elements from N to M>N by adding zeros). A radio node may be adapted to configure another radio node (e.g., a user equipment) for a coding and/or a reference signaling to be detected and/or determined, e.g. by configuring one or more Golay sequences to be used, e.g. by transmitting the element indication and/or corresponding configuration data.

It may be envisioned that the reference signaling may comprise synchronisation signaling, in particular primary synchronisation signaling and/or secondary synchronisation signaling. Synchronisation signaling thus may be provided in a way allowing reliable and robust identification.

In some variants, the reference signaling is broadcast, e.g. in a cell, in particular synchronisation signaling. Such signaling may be efficiently identified if coded as described herein. Alternatively or additionally, the reference signaling may be dedicated signaling.

Processing reference signaling may comprise transmitting and/or receiving the reference signaling. Radio circuitry may generally comprise one or more transmitters and/or receivers for such transmitting and/or receiving. It may be considered that the radio node comprises one or more transmitting modules and/or one or more receiving modules for such transmitting and/or receiving, which may be implemented in the processing circuitry and/or radio circuitry. Alternatively or additionally, processing may comprise encoding the coding and/or decoding the coding. In particular, processing may comprise encoding and transmitting, and/or receiving and decoding. Processing circuitry may be adapted for, and/or used for, encoding and/or decoding, and/or the radio node may comprise a corresponding encoding module and/or decoding module. Processing, in particular receiving and/or decoding) may comprise identifying the reference signaling and/or associated frequency/ies (or related interval/s), respectively associated signals and/or symbols, and/or one or more components or sequences thereof.

Processing reference signaling may comprise determining a signaling sequence, e.g. using a determining module and/or processing circuitry. Processing and/or determining may comprise (if receiving) detecting the reference signaling and/or (if transmitting) constructing a signaling sequence. A detector for such detecting, and/or a constructor for such constructing, may be implemented as a module and/or in processing circuitry.

It may generally be considered that a radio node is adapted for transmitting and receiving reference signaling as described herein, for example transmitting synchronisation signaling and receiving sounding signaling or vice versa.

Reference signaling may generally comprise synchronisation signaling and/or cell reference signaling and/or channel state information reference signaling and/or demodulation signaling (in particular, if the radio node is a network node), and/or pilot signaling and/or sounding signaling and/or timing signaling (in particular, if the radio node is a user equipment). It may be considered that the reference signaling is beam-finding reference signaling and/or reference signaling for cell search and/or identification and/or timing estimation. In some cases, reference signaling may represent a random access preamble, and/or cell identification signaling.

Reference signaling may comprise two or more components. A component may comprise one or more signals or symbols of the reference signaling. Different components may be mapped based on different Golay sequences, in particular a pair of complementary sequences. Reference signaling may comprise a number of signals or symbols associated to, or equal to, the number of elements of the Golay sequence/s the coding is based on. A signal or symbol of reference signaling may be associated to and/or transmitted in a resource element. Signaling may comprise a sequence of symbols or signals, e.g. according to the Golay sequence/s. Thus, signaling may be represented by, and/or referred to, as signaling sequence. The sequence may cover time and/or frequency resources based on, and/or coded based on, the Golay sequence/s. A signaling sequence may be based on a repeated Golay sequence.

Reference signaling may be OFDM (Orthogonal Frequency Division Multiplexing) signaling and/or Single-carrier and/or DFTS-OFDM (Discrete Fourier Transform Spreading-OFDM) signaling. Signals or symbols may be formed according to such signaling.

Coding may generally comprise and/or represent a map of signals and/or symbols of reference signaling to time and/or frequency resources. The map may be based on one or more Golay sequences, e.g. as a form of coding based on the sequence/s. A time resource may described a time interval, in particular one or more symbol time intervals and/or subframes and/or transmission time intervals (TTIs). Such a time interval may be according to a communication standard, e.g. a 3GPP 5G standard like NR (New Radio) or LTE (Long Term Evolution) evolution. A frequency resource may comprise a frequency and/or frequency interval (e.g., bandwidth), e.g. used for transmission, in particular a subcarrier or related bandwidth, or similar, like a carrier or subdivision thereof, respectively an associated bandwidth. A frequency interval may be divided into two or more subintervals, e.g. carriers. A carrier may be divided into several subintervals, e.g. subcarriers, each of which may be associated to a frequency resource (element). A subcarrier and an associated symbol time interval may be considered a resource element. A symbol time interval may be a time interval associated to a symbol of signaling. A subframe or TTI may comprise a plurality of symbols.

It may be considered that a coding maps, and/or that mapping comprises, each element of a Golay sequence to another time interval, e.g. symbol time interval, which may be successive for successive elements. Alternatively or additionally, a map or mapping may be such that a sequence is mapped to a frequency range comprising a plurality of subcarriers (e.g., covering one or more carriers, which may be neighboring), e.g. such that a shift in subcarriers from a preceding subcarrier is determined by the corresponding element, e.g. based on determined beginning subcarrier (the subcarriers may be represented by a numbered reference for mapping). Thus, an element of a sequence may represent a frequency or subcarrier shift. Generally, a coding may identify where on a grid of time-frequency resources the signals or symbols of the associated signaling are located.

A radio node may generally be considered a device or node adapted for wireless and/or radio (and/or microwave) frequency communication, and/or for communication utilising an air interface, e.g. according to a communication standard.

A radio node may be a network node or a user equipment or terminal. A network node may be any radio node of a wireless communication network, e.g. a base station and/or gNodeB (gNB) and/or relay node and/or micro/nano/pico/femto node and/or other node, in particular for a RAN as described herein. For an implementation of the radio node as network node. The terms user equipment (UE) and terminal may be considered to be interchangeable in the context of this disclosure. A user equipment or terminal may represent and end device for communication utilising the wireless communication network, and/or be implemented as a user equipment according to a standard. Examples of user equipments may comprise a phone like a smartphone, a personal communication device, a mobile phone or terminal, a computer, in particular laptop, a sensor or machine with radio capability (and/or adapted for the air interface), in particular for MTC (Machine-Type-Communication, sometimes also referred to M2M, Machine-To-Machine), or a vehicle adapted for wireless communication. A user equipment may be mobile or stationary.

A radio node may generally comprise processing circuitry and/or radio circuitry. Circuitry may comprise integrated circuitry. Processing circuitry may comprise one or more processors and/or controllers (e.g., microcontrollers), and/or ASICs (Application Specific Integrated Circuitry) and/or FPGAs (Field Programmable Gate Array), or similar. It may be considered that processing circuitry comprises, and/or is (operatively) connected or connectable to one or more memories or memory arrangements. A memory arrangement may comprise one or more memories. A memory may be adapted to store digital information. Examples for memories comprise volatile and non-volatile memory, and/or Random Access Memory (RAM), and/or Read-Only-Memory (ROM), and/or magnetic and/or optical memory, and/or flash memory, and/or harddisk memory, and/or EPROM or EEPROM (Erasable Programmable ROM or Electrically Erasable Programmable ROM). Radio circuitry may comprise one or more transmitters and/or receivers and/or transceivers (which may operate as transmitter and receiver), and/or may comprise one or more amplifiers and/or oscillators and/or filters, and/or may comprise, and/or be connected or connectable to antenna circuitry and/or one or more antennas.

Any one or all of the modules disclosed herein may be implemented in software and/or firmware and/or hardware. Different modules may be associated to different components of a radio node, e.g. different circuitries or different parts of a circuitry. It may be considered that a module is distributed over different components.

A wireless communication network may be a Radio Access Network (RAN), in particular according to a communication standard. A communication standard may in particular a standard according to 3GPP and/or 5G, e.g. according to NR or LTE Evolution.

There may also be considered a program product comprising instructions, the instructions causing processing circuitry to perform and/or control any one or any combination of the methods described herein. Instructions may be implemented as code.

A carrier medium arrangement carrying and/or storing a program product as described herein is also proposed.

BRIEF DESCRIPTION OF THE DRAWINGS

The drawings are provided to illustrate the approaches and concepts described herein, and are not intended to limit their scope. They comprise:

FIG. 18, showing an exemplary method for operating a radio node; and

FIG. 19, showing a further exemplary radio node.

DETAILED DESCRIPTION

Synchronization sequences respective associated signaling are described as example for reference signaling in the following. Herein, a radio node like a UE is referred to as a receiver receiving and decoding/detecting signaling, and a radio node like a base station or eNB (LTE base station) or gNB (NR base station) is referred to as transmitter transmitting and/or encoding.

When a UE is powered on, or when it moves between cells in LTE release 8, it receives and synchronizes to downlink signals in a cell search procedure. The purpose of this cell search is to identify the best cell and to achieve time and frequency synchronization to the network in downlink (i.e. from base station to UE). The Primary and Secondary Synchronization Signals (PSS and SSS) are used at cell search in the UE for LTE. Here, in the case of FDD (Frequency Division Duplexing), the PSS is transmitted in the last OFDM symbol of slots 0 and 10 within a frame and the SSS is transmitted in the OFDM symbol preceding PSS, see the illustration in FIG. 1. In the case of TDD (Time Division Duplex), the PSS is transmitted in the third OFDM symbol of slots 3 and 13 within a frame, and the SSS is transmitted in the last OFDM symbol of slots 2 and 12, i.e., three symbols ahead of the PSS.

Detectors are discussed in the following. A detector may be implemented in a receiver, e.g. a user equipment or terminal. A detector may generally be adapted for detecting reference signaling. Detecting reference signaling may be considered to comprise identifying the signals or symbols belonging to a reference signaling sequence of signals or symbols.

Figure 2:
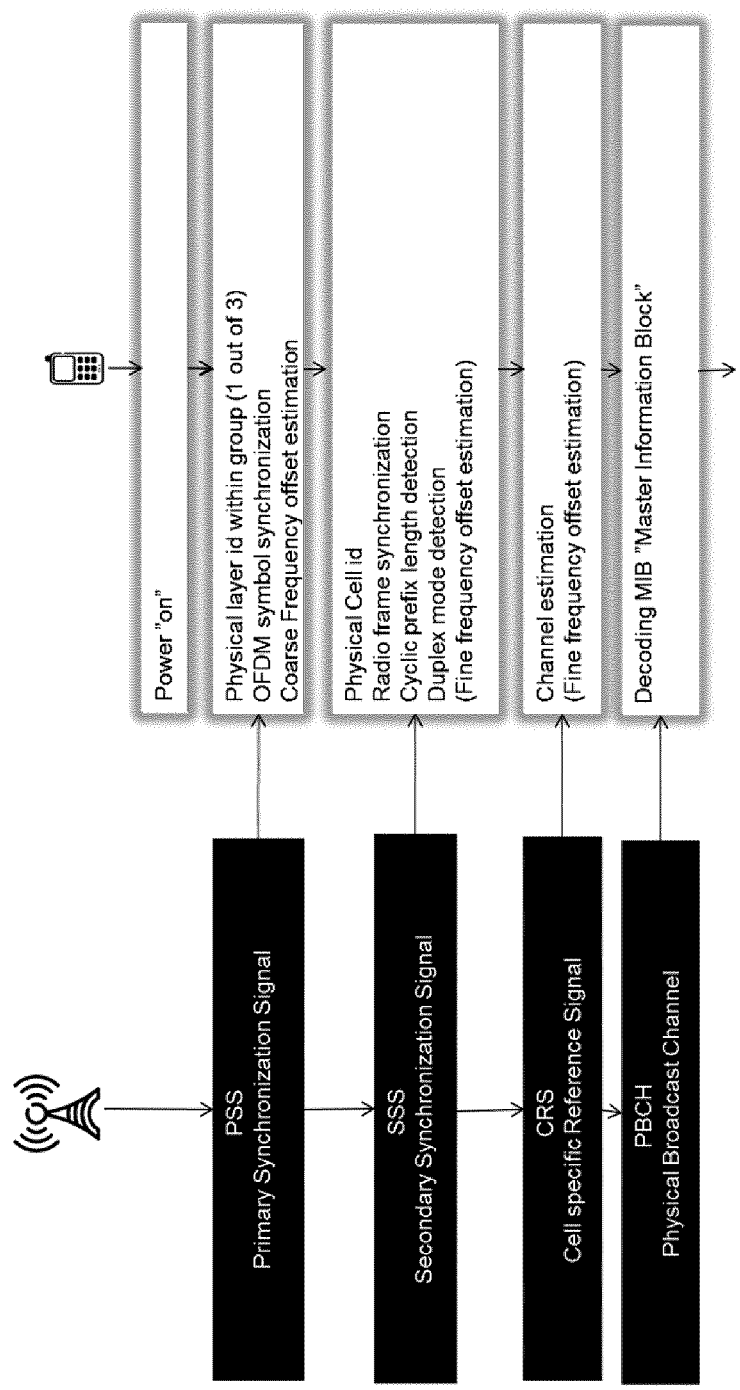
FIG. 2, showing initial cell search procedure for LTE release 8.

A simplified initial cell search procedure is illustrated in FIG. 2. Here the UE tries to detect PSS from which it can derive the cell identity within a cell-identity group, which consists of three different cell identities corresponding to three different PSS. In this detection, as shown in the illustration in FIG. 3, the UE thus has to blindly search for all of these three possible cell identities. This is done by calculating a cross-correlation between received signals and the candidate PSS sequence. Here a cross-correlation is calculated in a time domain matched filter, followed by an absolute square operation.

The UE also achieves OFDM symbol synchronization and a coarse frequency offset estimation with an accuracy of about 1 kHz. The latter is estimated by the UE by evaluating several hypotheses of the frequency error. Many operations have to be done for each of these frequency offset hypothesis. Typically, the lowpass filter, three time domain matched filters, and three absolute square operations have to be done for each hypothesis. Then the search for peak is done over all frequency offset hypothesis and cell id groups.

Figure 3:
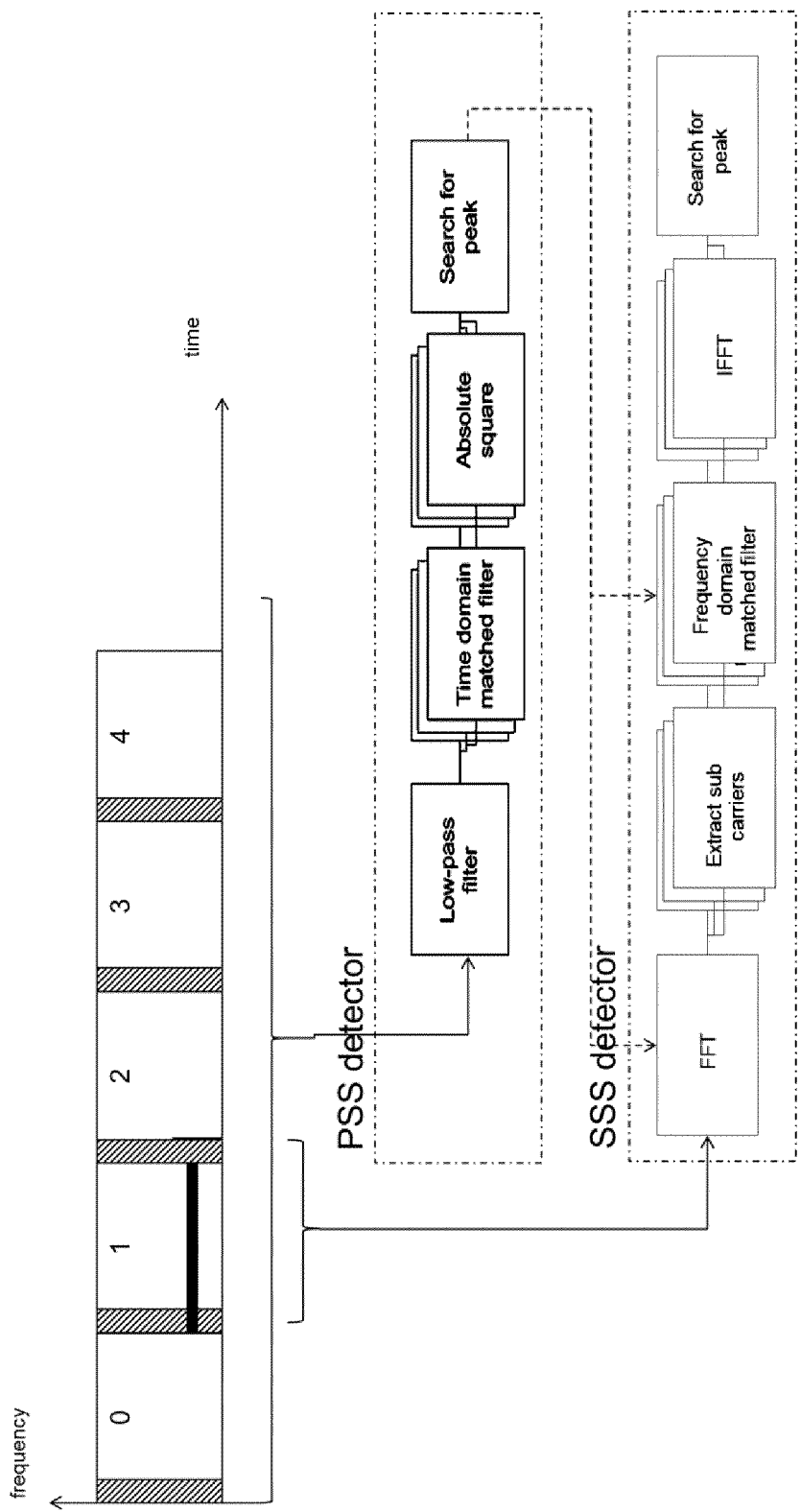
FIG. 3, showing detectors for PSS and SSS.

The UE can then continue to detect SSS (coherent detection thanks for the PSS decoding) from which it acquires the physical cell id and achieves radio frame synchronization, see FIG. 3. Here, the UE also detects if normal or extended cyclic prefix is used. If the UE is not preconfigured for either TDD or FDD, the UE can detect the duplex mode by the position in the frame of detected SSS in relation to detected PSS. Fine frequency offset estimation can be estimated by correlating PSS and SSS. Alternatively, this fine frequency offset estimation is estimated by using the Cell specific Reference Signals (CRS) which are derived from the Physical Cell Identity (PCI) encoded in the PSS/SSS. Once the UE is capable of decoding the CRSs the UE can receive and decode cell system information which contains cell configuration parameters starting with the Physical Broadcast Channel (PBCH).

Figure 4:
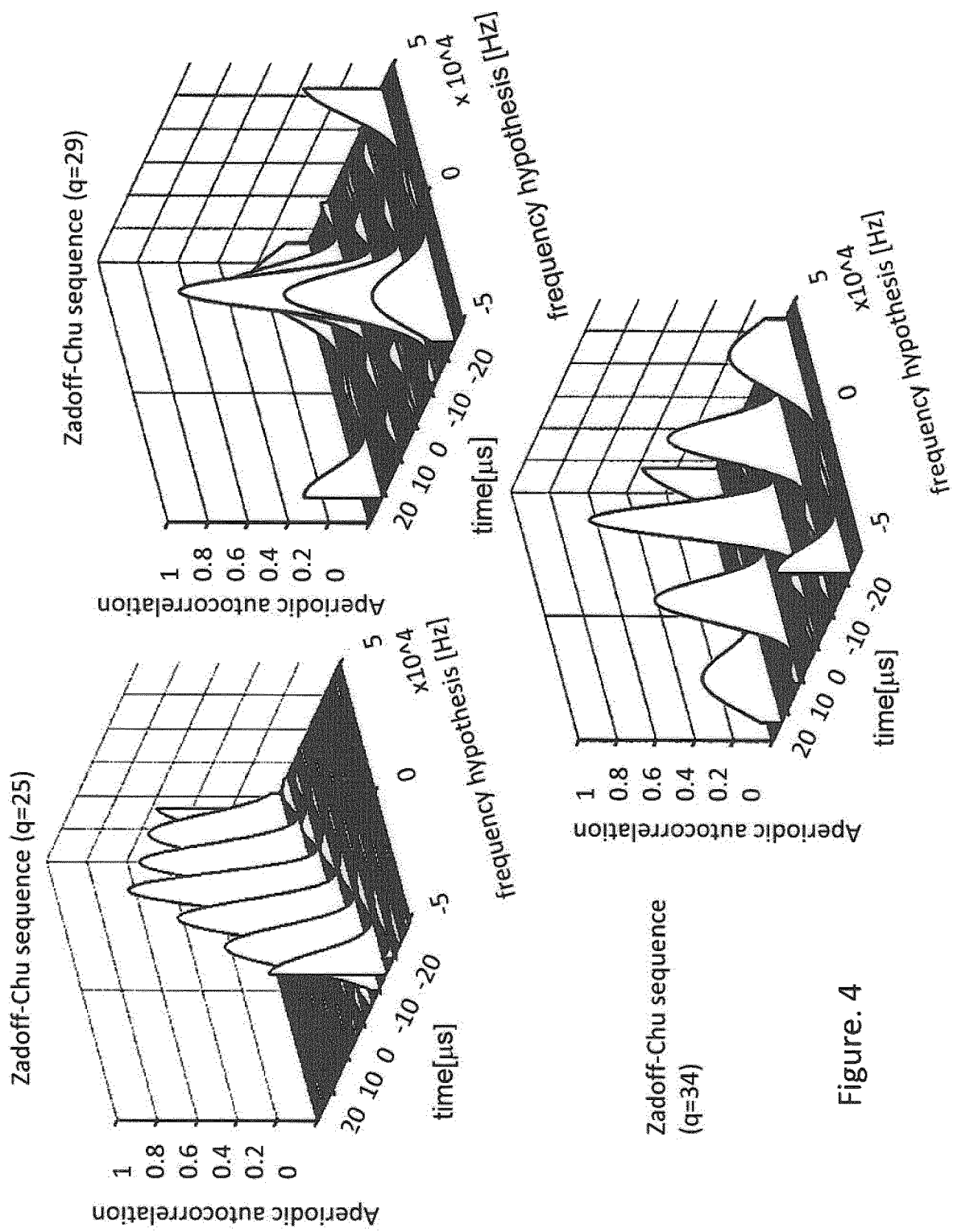
FIG. 4, showing receiver correlation with timing and frequency offset candidates, FIG. 5, showing autocorrelations of the two complementary sequences and the sum of these autocorrelations, FIG. 6, showing correlation with two Golay complementary sequences.

Frequency errors can occur due to imperfect oscillators and movement of the UE relative to the base station. Typically, frequency errors up to 20 ppm (part per million) of the carrier frequency must be handled during initial cell search when receiving synchronization signals such as PSS. For a carrier frequency of 2.5 GHz, the frequency error can thus be +−50 kHz. As mentioned earlier, this frequency error can be estimated by detecting PSS for several pre-rotations with different candidates of the frequency errors. A few illustrations of receiver cross correlations in the detector are given in FIG. 4

Figure 1:
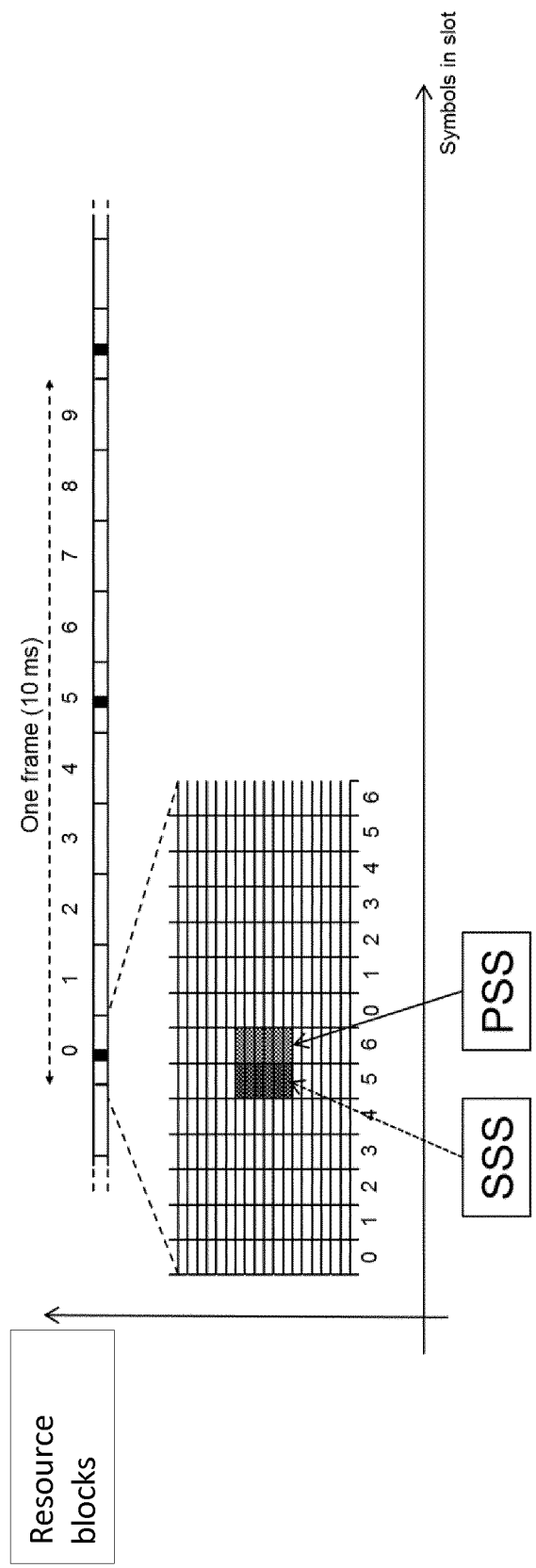
FIG. 1, showing PSS and SSS as in LTE FDD release 8.

The drawings are provided to illustrate the approaches and concepts described herein, and are not intended to limit their scope. They comprise:

FIG. 1, showing PSS and SSS as in LTE FDD release 8;

FIG. 2, showing initial cell search procedure for LTE release 8;

FIG. 3, showing detectors for PSS and SSS;

Figure, with frequency error candidates between +−50 kHz, for a Zadoff-Chu sequences as used in LTE release 8. The correct frequency and timing errors are 0 Hz and 0 microseconds, respectively, in these illustrations.

Golay complementary sequences are discussed in the following.

Golay complementary sequences were introduced by Marcel Golay. These sequences are interesting for reference signaling, in particular in the context of synchronization, for at least two reasons:
1. The sum of the autocorrelations from a complementary pair is ideal
2. Low computational complexity when calculating correlations A pair of Golay complementary sequences may be denoted as $$\{a(0),a(1),\ldots,a(N-1)\} \qquad (1)$$

and $$\{b(0),b(1),\ldots,b(N-1)\}. \qquad (2)$$

Also, the aperiodic autocorrelations of these sequences are denoted as $$C_a(k) = \sum_{n=0}^{N-k-1} a*(n)a(n+k) \text{ and} \qquad (3)$$

$$C_b(k) = \sum_{n=0}^{N-k-1} b*(n)b(n+k). \qquad (4)$$

and $$C_b(k)=\Sigma_{n=0}^{N-k-1}b*(n)b(n+k). \qquad (4)$$

Figure 5:
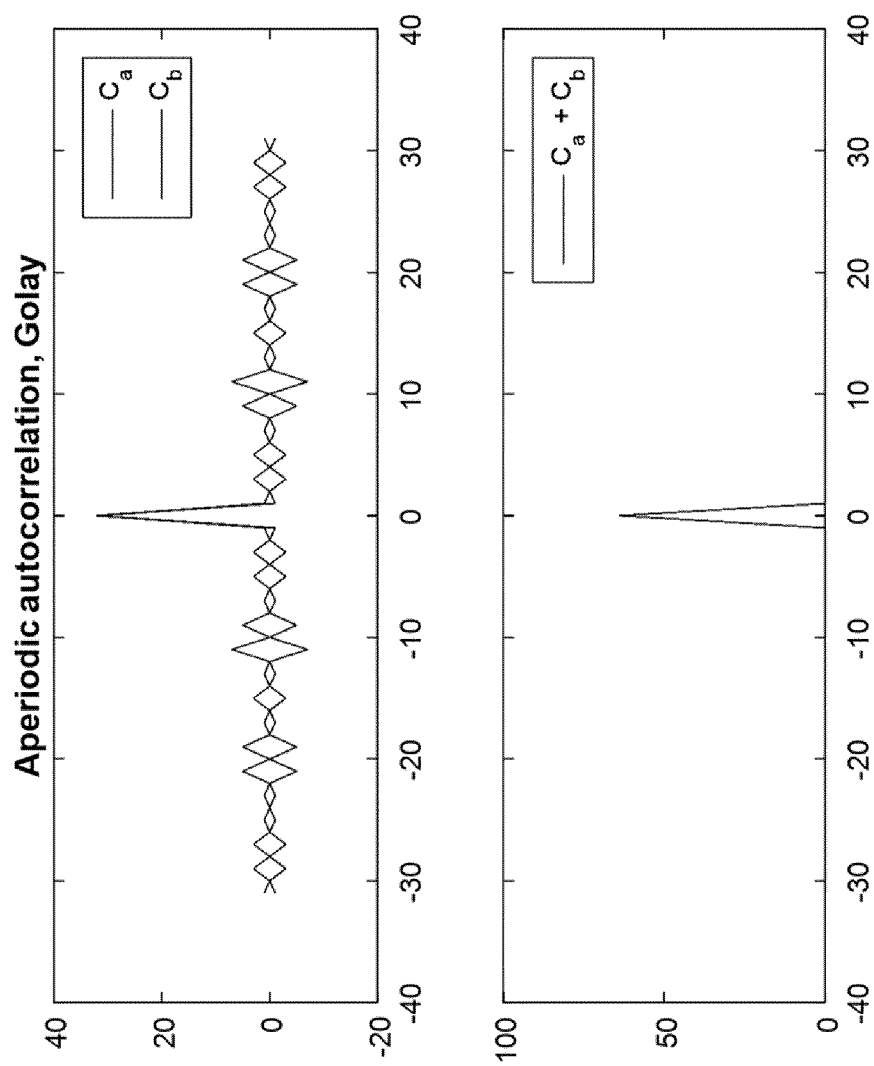

Then the sum of these autocorrelations is a perfect "Dirac delta function" i.e.

$$C_a(k)+C_b(k)=\delta(k) \qquad (5)$$

where $\delta(k)=1$ for $k=0$ only and zero otherwise, which is illustrated in FIG. 5. Equation 3 to 5 may be considered to define (complementary) Golay sequences.

A second property of Golay complementary sequences is that the computational complexity for calculating a correlation is low. A sequence diagram is given in FIG. 6 from which correlations with two complementary sequences are calculated simultaneously.

Figure 7:
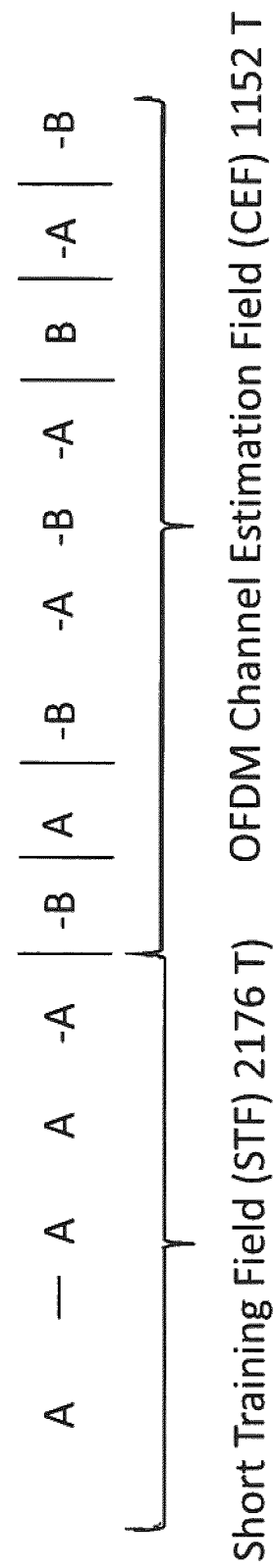
FIG. 7, showing an exemplary Golay sequence.

A Golay sequence may be used for timing synchronization as illustrated in FIG. 7. Here $$G_{a_{128}}=\{a(0),a(1),\ldots,a(N-1)\} \qquad (6)$$

is a 128 symbol long Golay sequence. This sequence is repeatedly transmitted 16 times within the short training field, as illustrated in FIG. 7, followed by one transmission with changed sign. A very simple receiver, as in FIG. 6, can be constructed in which the received signal is correlated with the known 128 samples long Golay sequence.

Figure 8:
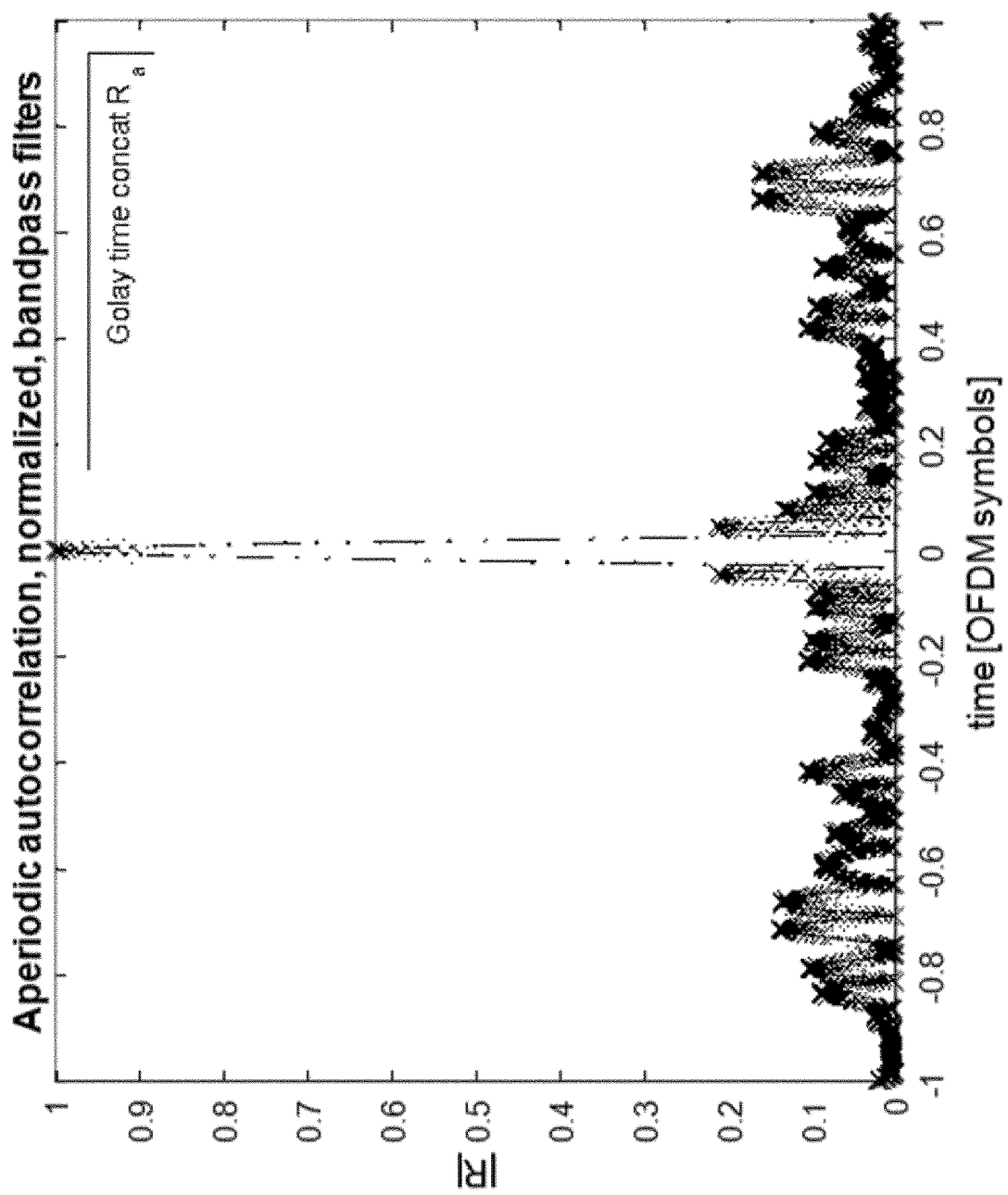
FIG. 8, showing autocorrelation of a repeated Golay sequence.

The received signal in the detector will include a few of the last samples of a transmitted Golay sequence followed by the first samples of an identical Golay sequence in most correlations. This will result in a non-ideal correlation, as illustrated in FIG. 8.

Figure 9:
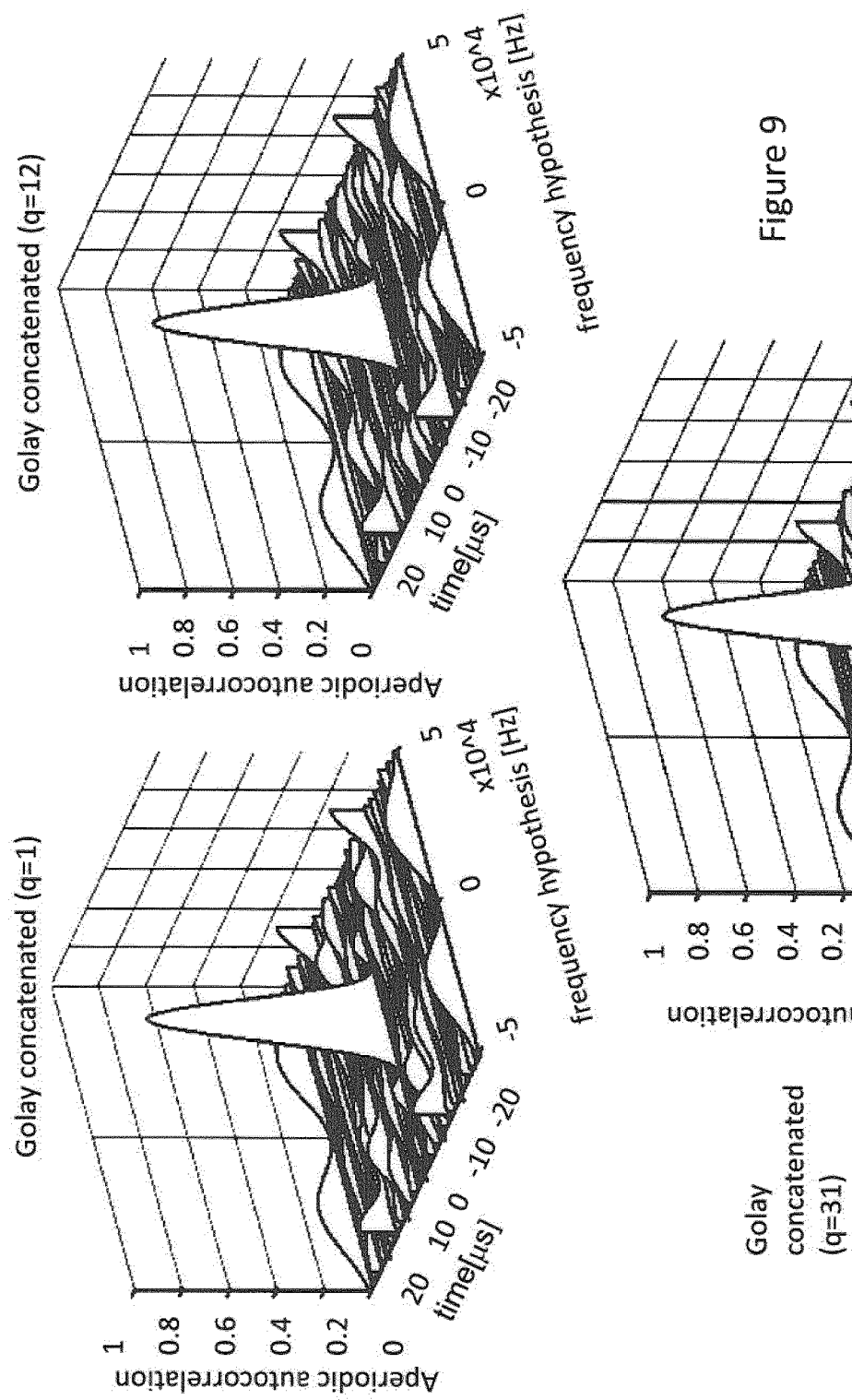
FIG. 9, showing an exemplary Golay sequence with timing and frequency offset candidates.

A few illustrations of receiver correlations in the detector are given in FIG. 9, with frequency error candidates between +−50 kHz, for a three different Golay sequences.

The use of Zadoff-Chu as in current LTE sequences as synchronization signals is very sensitive to frequency errors. The autocorrelations, both with and without frequency errors have many false peaks which cause detections for other than the true timing and frequency error. This leads to timing and frequency offsets after synchronization. This is visible in FIG. 4 as additional peaks for nonzero delays and frequency offsets. False peaks and estimation errors also occur when using a Golay sequence as the synchronization signal, as shown in FIG. 9.

For a variant, it is proposed constructing a time synchronization and/or beam finding reference signal by two differentially encoded complementary sequences which are multiplexed in frequency into one time interval.

Reference signaling, in particular a synchronization signaling sequence, may be constructed which
has a detector with very low correlation peaks for nonzero delay errors
has a detector which is robust against frequency errors
has a detector with very low computational complexity
Transmitters are discussed in the following. A transmitter may in particular be implemented as, and/or as part of, radio node like a network node.

Figure 10:
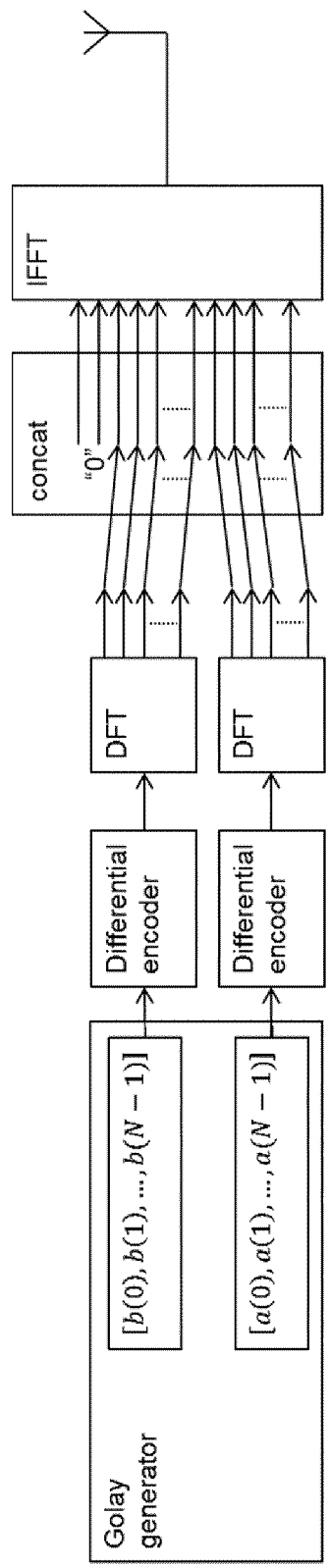
FIG. 10, showing a block based synchronization signal transmitter using DFTS-OFDM.

An illustration is given in FIG. 10 of a transmitter for the proposed method of processing (constructing) a reference signal from differential encoded Golay complementary sequences. Here two DFTs (Discrete Fourier Transform), one for each of the complementary sequences, are followed by a concatenation and an inverse FFT (Fast Fourier Transform). This construction of a DFT followed by a larger IFFT is also known as DFTS-OFDM and is block based since a block of the transmitted signal is constructed within one IFFT.

Figure 11:
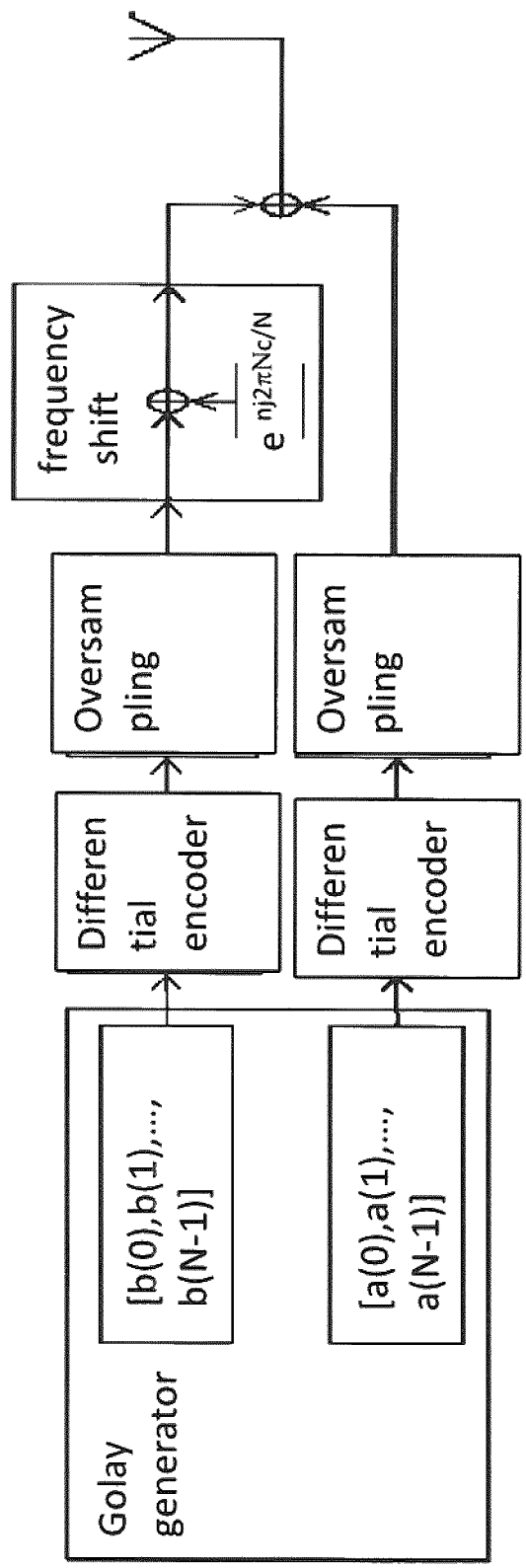
FIG. 11, showing a linear synchronization signal transmitter using frequency shift.

An alternative transmitter structure is illustrated in FIG. 11, where an oversampling and interpolation is followed by a frequency shift, which modulates (at least) one of the differential encoded sequences such that they span different, essentially non-overlapping, frequency intervals. This transmitter is linear since all processing is done with linear processing blocks in a sample-by-sample manner.

The construction by DFTS-OFDM in FIG. 10 may be beneficial for base-station implementations built with an IFFT close to the antenna ports. Here, a construction with an IFFT close to the antenna ports can be a software implementation build upon all downlink signals processed with IFFTs. Also, the base station might be designed with IFFTs in hardware which is physically placed close or inside the radio equipment such that having a signal which is not processed with an IFFT would add a significant amount of extra software or hardware support.

The block of signal values constructed by the DFTS-OFDM in FIG. 10 is cyclic within the OFDM symbol, in contrast to the linear processing as illustrated in FIG. 11. A receiver structure is presented next which is based on linear processing. The receiver is thus constructed for a linear signal and will have some performance loss when combined with the block based cyclic signals as compared to using a linear transmitter.

A receiver is discussed in the following. A receiver may in particular be implemented as, and/or as part of, a radio node like a user equipment or terminal.

The signals generated by the two transmitter versions are preferable decoded using corresponding matching receiver formulations; a mismatch will lead to slightly degraded performance.

Block-based generated signaling is discussed in the following, as an example of processing reference signaling.

Figure 12:
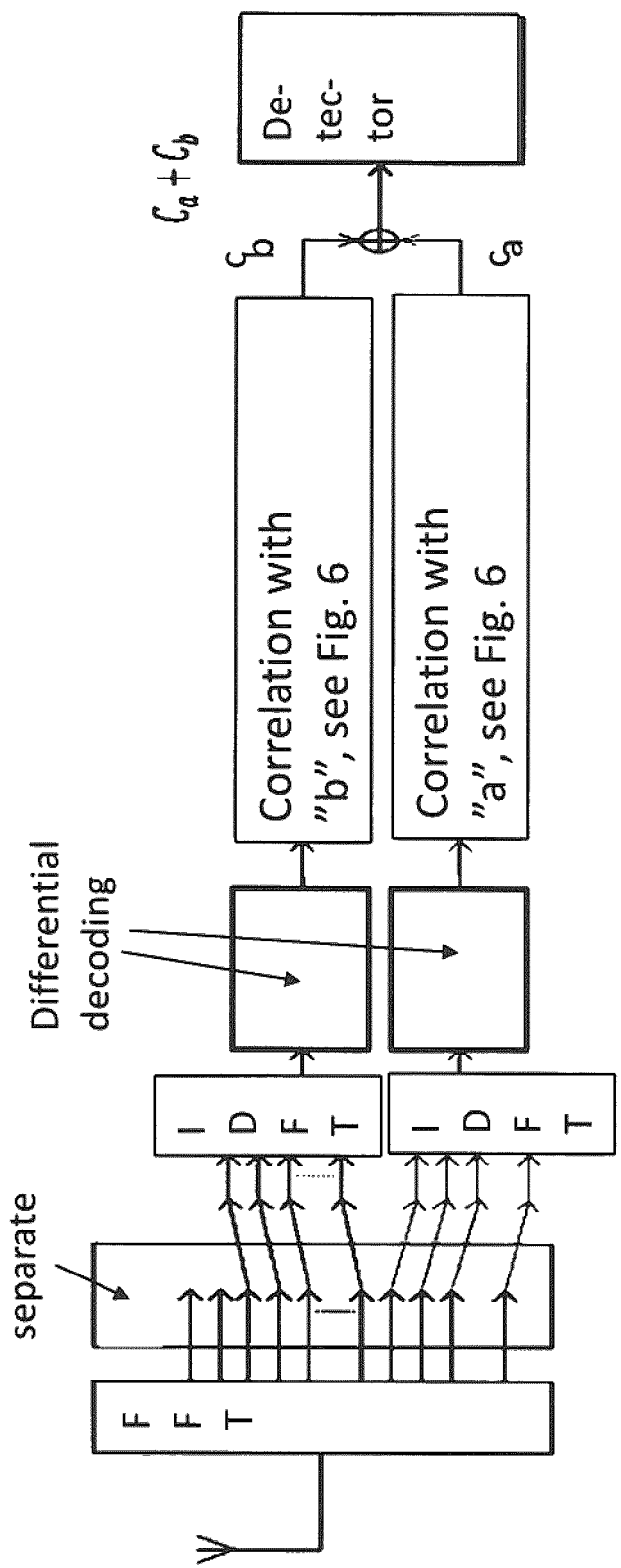
FIG. 12, showing a receiver for differential encoded sequences with block-based transmission.

The block-based transmitter in FIG. 10 is matched by a receiver depicted in FIG. 12. The frequency-domain signal is separated into the two constituent DFT components and converted back to the original sequences. Differential decoding operations are followed by correlation stages with the two complementary Golay sequences. Finally, the two correlations are added before detection.

If several possible synchronization sequences exist, the correlation stage pairs are repeated for each such sequence, while the FFT processing complexity does not change.

To extract the synchronization signal contents in the frequency domain, the FFT input samples must cover the entire OFDM symbol. Since the symbol timing is not known a priori, a simple solution is to perform an FFT and repeat the processing above at several sample timing candidates, which however may be computationally expensive.

To remove the FFT window placement uncertainty, the approach of oversampled FFT may be used. The receiver places double-length, 2N-FFT windows in time domain (2N is an example, other FFT length longer than N work as well), with adjacent FFTs overlapping by N samples (the symbol length). That way, every second FFT window captures an entire OFDM symbol. The transmitted OFDM symbol may contain reference symbols (not shown in FIG. 10) to estimate and remove the resulting frequency rotation, effectively restoring the proper symbol timing. This approach works particularly well if the neighboring OFDM symbols are known to not to contain the sequence.

Another possible variant of the receiver for the block-based signal applies the sliding window FFT approach: a full FFT is performed at an initial time, but at each subsequent sample time, only FFT (DFT) output contribution (negative contribution) due to one new input sample (due to one input sample falling outside the new DFT window) is computed, while a linearly increasing exponential factor is applied to the corrected FFT output values to account for the time shift of the previous input samples. The number of multiplications for each FFT update is O(N), more specifically proportional to the allocated subcarriers in the FFT.

To formulate yet another variant for the receiver, it should be noted that the transmitter operations Golay encoding-Diff encoding→DFT→IFFT create an N-sample long time-domain sequence. A matched filter may be implemented by correlating the received signal with this time-domain sequence, which provides an alternative receiver. However, the correlation complexity is higher since the Golay sequence properties are not utilized.

Linearly generated signaling is discussed in the following as example of determining a coding.

Figure 13:
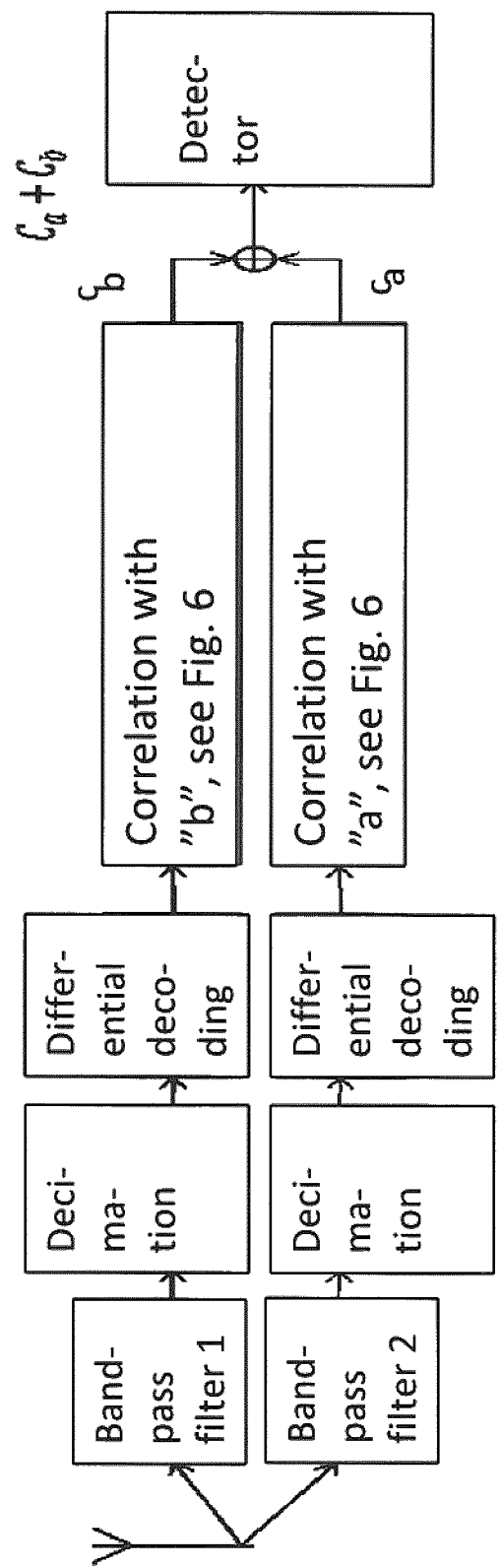
FIG. 13, showing a receiver of two frequency shifted differential encoded sequences.

A receiver structure for the linear transmitter in FIG. 11 is illustrated in FIG. 13, where two different bandpass filters are used to extract the different frequency allocations for the two differentially encoded Golay sequences. Again, differential decoding operations are followed by correlation stages with the two complementary Golay sequences. Finally, the two correlations are added before detection.

The linear receiver processing amounts to time-domain matched filtering and correlation over a sliding window in time. If several possible synchronization sequences exist, the correlation stage pairs are repeated for each such sequence and complexity is proportional to the number of sequences.

Detailed descriptions of some of the above processing steps for the linear transmitter and receiver realizations of FIG. 10 and FIG. 13 are given below.

Differential encoding is discussed in the following. Differential encoding may be seen as implementation of differentially determining elements.

Example Golay sequences may be denoted as:

$$\{a(0), a(1), \ldots, a(N-1)\} \quad (7)$$

or $$\{b(0), b(1), \ldots, b(N-1)\}. \quad (8)$$

Equation (7) may represent a first Golay sequence, Equation (8) a second Golay sequence. Reference signaling may be based on one of such sequences, or on more than one. In particular, the first and second sequence may be complementary Golay sequences.

Differential coded Golay sequences may be defined as:

$$\tilde{a}(n) = \frac{a(n-1)}{\tilde{a}*(n-1)} \text{ and} \quad (9)$$

$$\tilde{b}(n) = \frac{b(n-1)}{\tilde{b}*(n-1)}, \quad (10)$$

with $\tilde{a}(0)=1$; $\tilde{b}(0)=1$ for $n=1 \ldots N$. Other differential encoding (and corresponding decoding schemes) are also possible, e.g. utilising a constant factor, and/or referring to different preceding elements.

Modulation (encoding) is discussed in the following.

Sub-carrier mapping (mapping to frequency resources) may be formulated as rotation (with starting sub-carrier $N_c$), as an example of encoding or determining coding:

$$\bar{a}(n) = \tilde{a}(n) \quad (11)$$

and $$\bar{b}(n) = \tilde{b}(n) e^{j2\pi n N_c / N_{fft}} \quad (12)$$

The sub-carrier shift is typically selected as $N_c=N+1$. Selection of larger values (than $N_c=N+1$) may be beneficial in terms of better separation (and less interference between) the two differentially coded Golay sequences.

An exemplary channel is discussed in the following.

The radio channel is a model of the propagation from transmission (in the base station) to the receiver (in the UE). Here a simple channel model is used, equal to a constant complex scaling, delay $n_0$ and additive noise and interference. Within the current section, this radio channel also includes the interpolation, bandpass filters and decimations. The same model is also used both for the DFTS-OFDM in FIG. 10 and the frequency shift transmitters in FIG. 11.

The two complementary sequences are modelled separately as $$\tilde{r}_a(n) = h\bar{a}(n-n_0) + w_a(n) \quad (13)$$

and $$\tilde{r}_b(n) = h\bar{b}(n-n_0) + w_b(n) \quad (14)$$

De-rotation is discussed in the following. De-rotation may be part of decoding and/or receiving. The radio node may comprise a derotation module for such derotation, and/or may be adapted for using the processing circuitry therefor.

Compensate for the sub-carrier shift (or sub-carrier mapping) by $$\tilde{r}_a(n) = \bar{r}_a(n) \quad (15)$$

and $$\tilde{r}_b(n) = \bar{r}_b(n) e^{j2\pi n N_c/N_{fft}} \quad (16)$$

Inserting (11) and (13) into (15) results in $$\tilde{r}_a(n) = h\tilde{a}(n-n_0) + w_a(n) \quad (17)$$

Also, inserting (12) and (14) into (16) results in $$\tilde{r}_b(n) = e^{-j2\pi n_0 N_c/N_{fft}} h\tilde{b}(n-n_0) + w_b(n) \quad (18)$$

Note that the received, de-rotated signal in (16) still has a complex exponential factor which depends on the unknown delay $n_0$. This complex exponential will be eliminated by the following differential decoding.

Differential decoding is discussed in an example in the following. Differential decoding may be part of, and/or an implementation of, differentially determining a coding.

The two complementary Golay sequences are differentially decoded according to $$r_a(n) = \tilde{r}_a(n+1)\tilde{r}_a^*(n) = |h|^2 a(n-n_0) + w_a(n)w_a^*(n-1) \quad (19)$$

and $$r_b(n) = \tilde{r}_b(n+1)\tilde{r}_b^*(n) = |h|^2 b(n-n_0) + w_b(n)w_b^*(n-1). \quad (20)$$

Correlations are discussed in the following.

Figure 6:
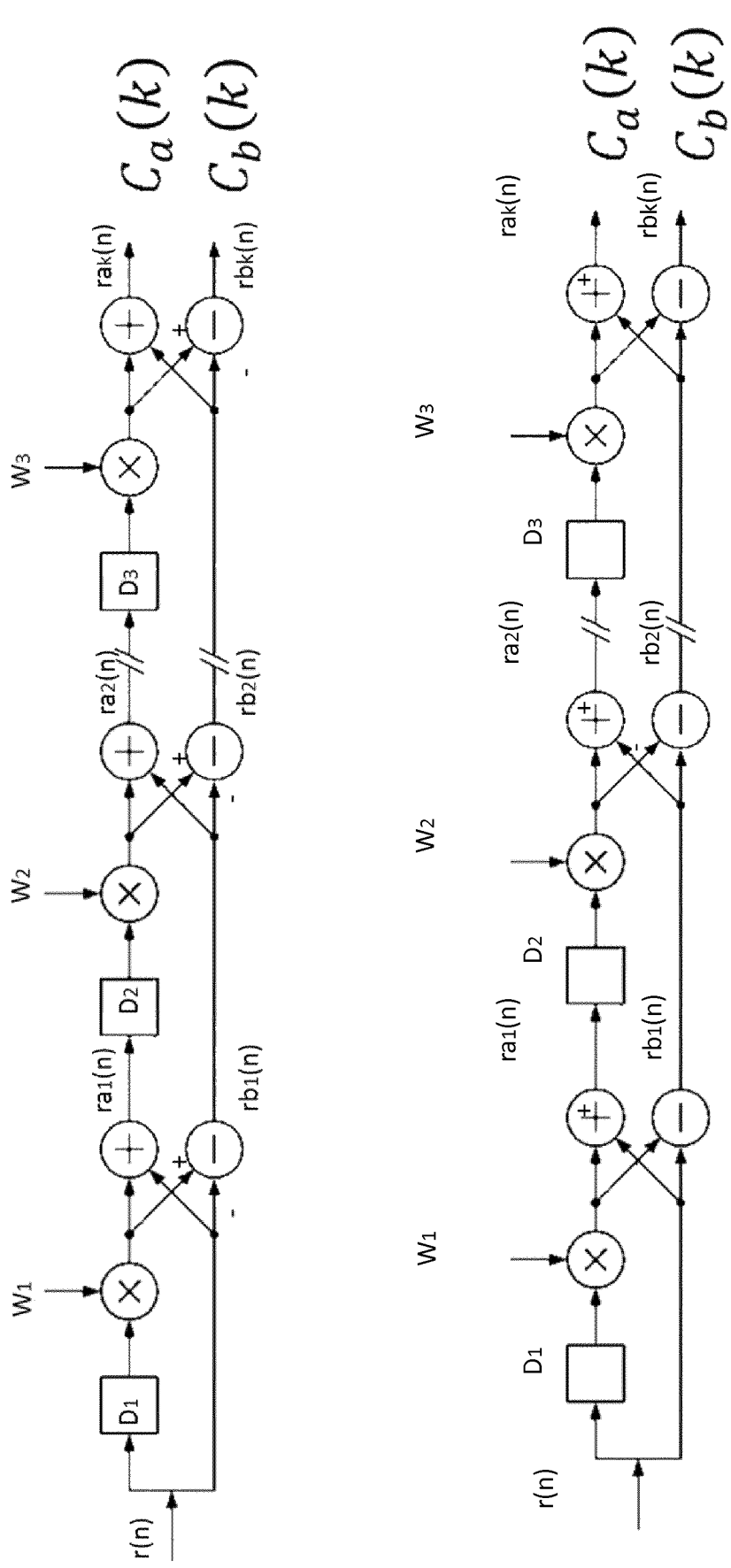

Correlation with the two complementary Golay sequences can be done with the receiver structure as illustrated in FIG. 6, which corresponds to $$\hat{C}_a(k) = \sum_{n=0}^{N-k-1} a*(n)r_a(n+k) \text{ and} \quad (21)$$

$$\hat{C}_b(k) = \sum_{n=0}^{N-k-1} b*(n)r_b(n+k) \quad (22)$$

Detection is discussed in the following.

Detection of timing equals the delay k, corresponding to the largest absolute square of the sum of these correlation, i.e.

$$\hat{k} = \arg\max_k |\hat{C}_a(k) + \hat{C}_b(k)|^2 \quad (23)$$

Aspects of DFTS-OFDM are discussed in the following.

The detection of the synchronization signals in the receiver, as illustrated in FIG. 13, is very much simplified if the decimation is done by an integer factor. For the transmitter based on DFTS-OFDM, as illustrated in FIG. 10, this requirement of integer decimations leads to restrictions in the relation between the length of the DFT and the length of the IFFT. Denote the size of the DFT as $N_{DFT}$ such that $$\tilde{A}(k) = \sum_{n=0}^{N_{DFT}-1} \tilde{a}(n) e^{-\frac{j2\pi kn}{N_{DFT}}} \text{ and} \quad (24)$$

$$\tilde{B}(k) = \sum_{n=0}^{N_{DFT}-1} \tilde{b}(n) e^{-\frac{j2\pi kn}{N_{DFT}}}, \quad (25)$$

Also, denote the size of the IFFT as $N_{IFFT}$ such that $$\tilde{s}(n) = \sum_{k=0}^{N_{DFT}-1} \tilde{A}(k) e^{\frac{j2\pi kn}{N_{IFFT}}} + \sum_{k=0}^{N_{DFT}-1} \tilde{B}(k) e^{\frac{j2\pi N_c n}{N_{IFFT}}} e^{\frac{j2\pi kn}{N_{IFFT}}}, \quad (26)$$

Note that the summations above are only needed over the $N_{DFT}$ values of $\tilde{A}(k)$ and $\tilde{B}(k)$. The decimation in the receiver can now be expressed as $$D = \frac{N_{IFFT}}{N_{DFT}} \quad (27)$$

Typical examples are $N_{DFT}=64$ and $N_{IFFT}=2048$ such that D=32.

From the design of Golay sequences, the length of a Golay sequence is typically $$N = 2^m 10^k 13^l \quad (28)$$

With m=6, k=0, l=0 follows that N=64.

Figure 14:
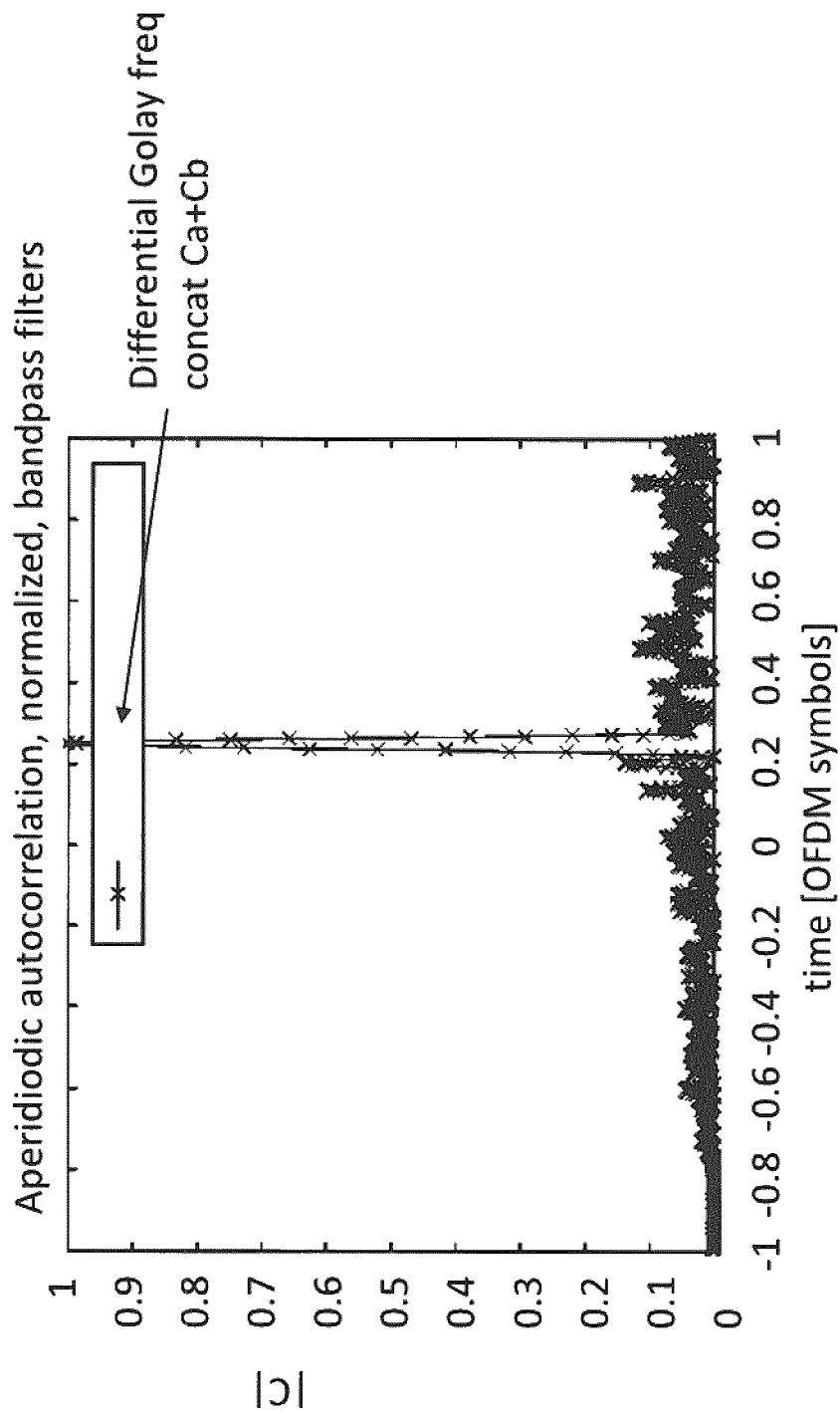
FIG. 14, showing pruning a differential sequence in time (before DFT)
Figure 15:
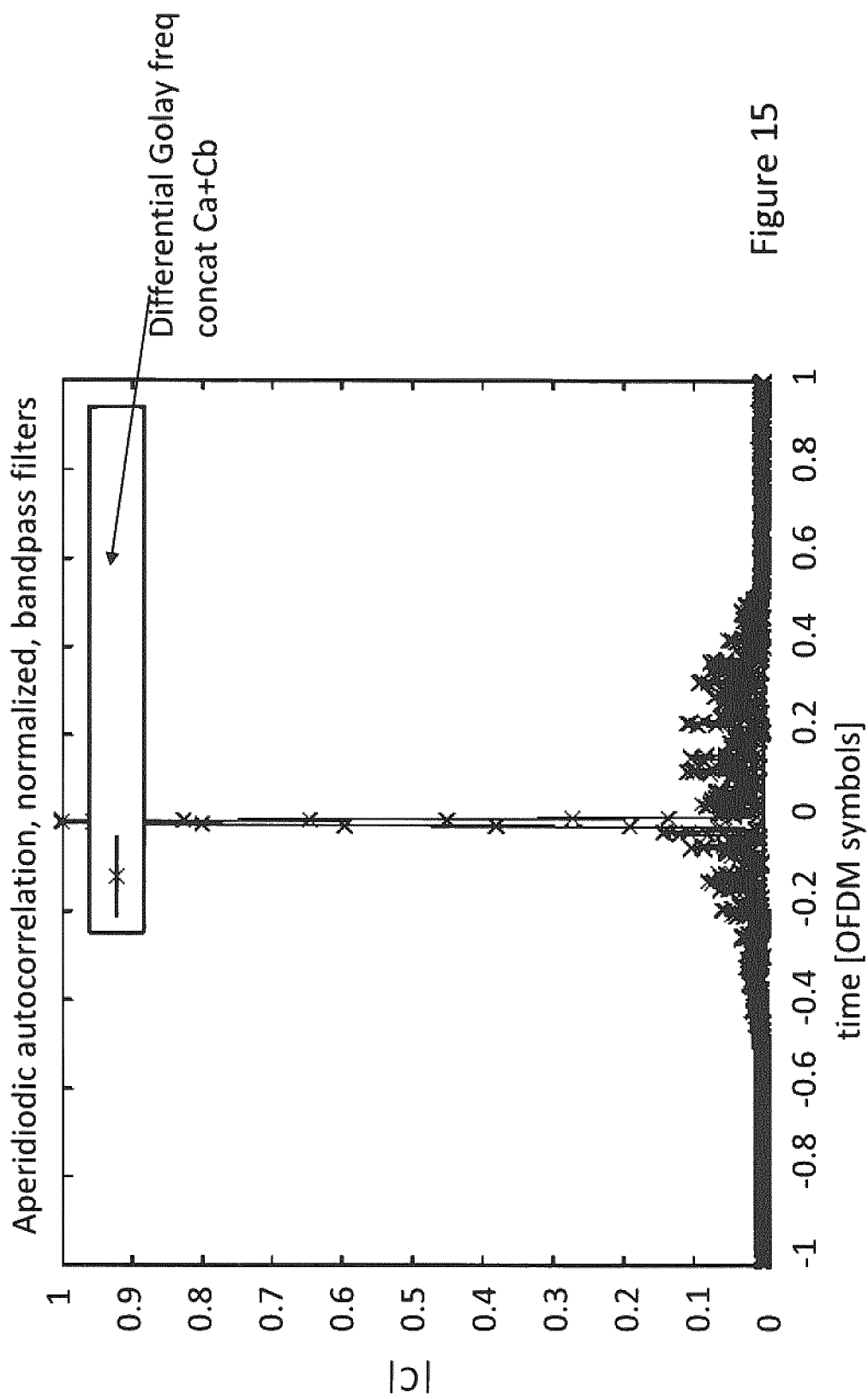
FIG. 15, showing zero padding in time (before DFT)

However, within the differential encoding, the length of sequence "over air" increases with one such that a sequence of 64 values increase to 65 values. Two different solutions are listed below in order to achieve integer decimation:

1. Prune differential sequence in time (before DFT), i.e. select $N_{DFT}=N$.
2. Zero padding in time (before DFT), i.e. $N_{DFT}>N$, e.g. $N_{DFT}=2N$ An illustration of the autocorrelation of pruned differential sequences is given in FIG. 14, and for zero padding in FIG. 15.

Frequency offset is discussed in the following.

Figure 16:
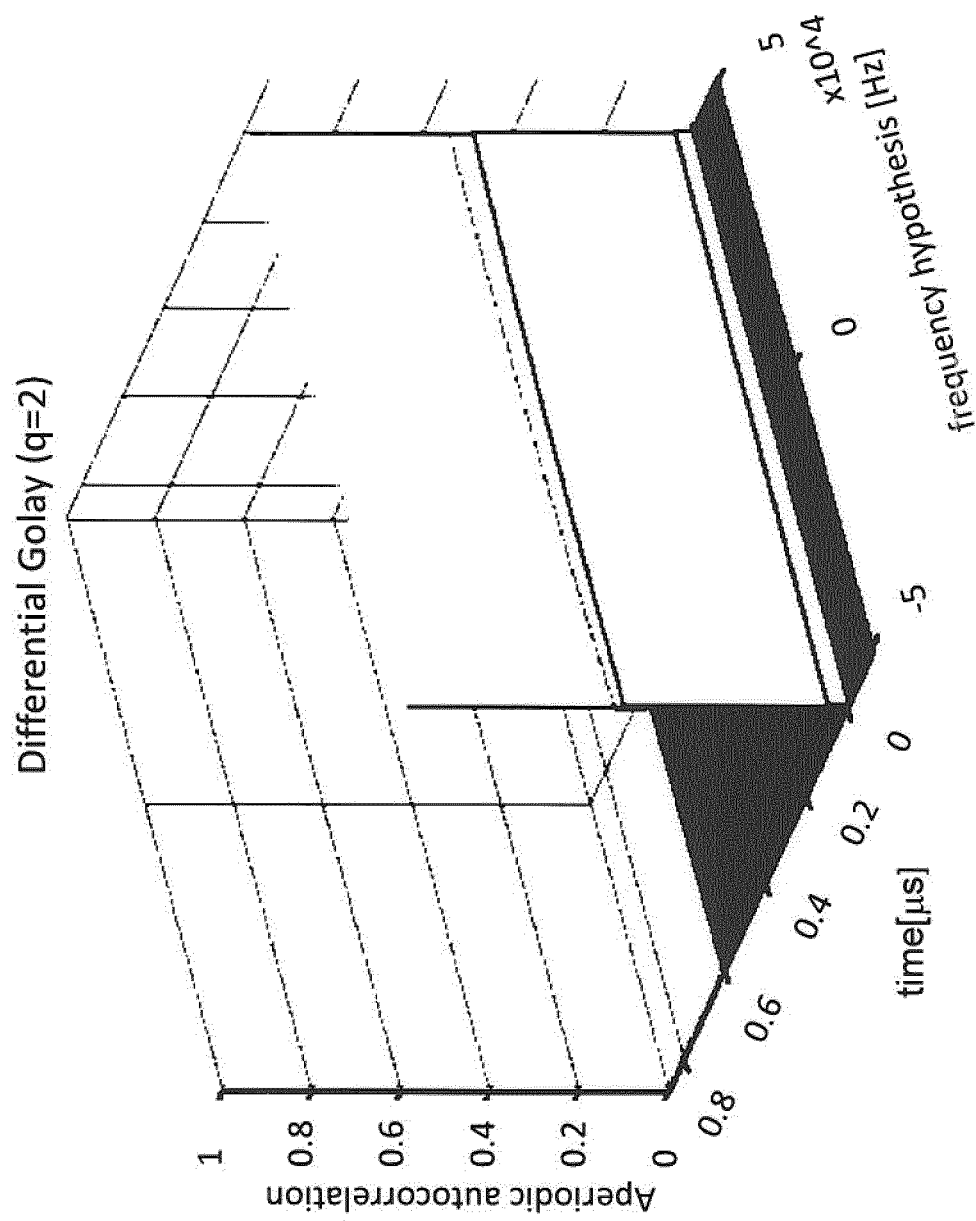
FIG. 16, showing autocorrelation of a differential decoded Golay sequence with frequency and timing errors.

The detection of synchronization signals is independent of frequency offset with the use of differential encoding and decoding, a related illustration is provided in FIG. 16. The actual frequency offset is estimated in a subsequent step using a symbol sequence ($\tilde{r}_a(n)$ or $\tilde{r}_b(n)$) in a non-differentially-decoded form, using the previously detected timing alignment value.

Alternative multiplexing of Golay-encoded sequences is described in the following. In FIG. 10, the two constituent (or component) sequences are multiplexed side-by-side in frequency by virtue of directly stacking the DFT outputs for the two sequences. This effectively yields a signal that is a sum of two single-carrier signals.

In some alternative variants, the DFT outputs may be interleaved in frequency according to a regular or pseudo-random pattern, e.g. to increase robustness to fast fading in dispersive channels. The receiver in FIG. 12 is then adapted by changing the mapping of FFT outputs to DFT inputs accordingly.

Separate time and frequency allocations are discussed in the following.

In yet another variant, the sequences are separated both in time and frequency. Then the single-carrier properties could be preserved. A drawback is that sequences would need to be shorter (given same total amount of resources), so that fewer orthogonal sequences are possible. However, if only a few different sequences are needed in some scenario, this solution could be a reasonable trade-off to reduce PAPR and thereby increase coverage.

Generally, there may be considered a synchronization signal constructed by differential encoding of two complementary sequences, which are mapped to different frequency intervals.

Figure 17:
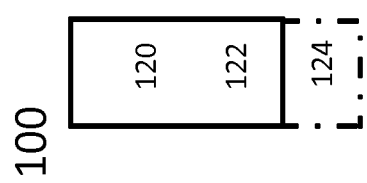
FIG. 17, showing an exemplary radio node.

FIG. 17 shows an exemplary radio node 100, which may be implemented as a network node or user equipment. Radio node 100 comprises processing circuitry (which may also be referred to as control circuitry) 120, which may comprise a controller connected to a memory. Any module, e.g. receiving module and/or transmitting module and/or configuring module of the radio node may be implemented in and/or executable by the processing circuitry 120. The processing circuitry is connected to control radio circuitry 122 of the radio node 100, which provides receiver and transmitter and/or transceiver functionality (e.g., comprising one or more transmitter and/or receiver and/or transceiver). An antenna circuitry 124 may be connected or connectable to radio circuitry 122 for signal reception or transmittance and/or amplification. The radio node 100 may be adapted to carry out any of the methods for operating a radio node disclosed herein; in particular, it may comprise corresponding circuitry, e.g. processing circuitry. The antenna circuitry may be connected to and/or comprise an antenna array.

FIG. 18 shows an exemplary method for operating a radio node. The method comprises an action RS10 of processing reference signaling based on a coding, the coding being based on a Golay sequence.

FIG. 19 shows an exemplary radio node. The radio node comprises a processing module RM10 for performing action RS10.

Receiving or transmitting on a cell or carrier may refer to receiving or transmitting utilizing a frequency (band) or spectrum associated to the cell or carrier. A cell may generally comprise and/or be defined by or for one or more carriers, in particular at least one carrier for UL communication/transmission (called UL carrier) and at least one carrier for DL communication/transmission (called DL carrier). It may be considered that a cell comprises different numbers of UL carriers and DL carriers. Alternatively or additionally, a cell may comprise at least one carrier for UL communication/transmission and DL communication/transmission, e.g., in TDD-based approaches.

A cell may be generally a communication cell, e.g., of a cellular or mobile or wireless communication network, provided by a node like a network node. A cell may be provided in a RAN. A serving cell may be a cell on or via which a network node (the node providing or associated to the cell, e.g., base station or eNodeB) transmits and/or may transmit data (which may be data other than broadcast data) to a user equipment, in particular control and/or user or payload data, and/or via or on which a user equipment transmits and/or may transmit data to the node; a serving cell may be a cell for or on which the user equipment is configured and/or to which it is synchronized and/or has performed an access procedure, e.g., a random access procedure, and/or in relation to which it is in a RRC_connected or RRC_idle state, e.g., in case the node and/or user equipment and/or network follow the LTE-standard. One or more carriers (e.g., uplink and/or downlink carrier/s and/or a carrier for both uplink and downlink) may be associated to a cell.

There is disclosed a carrier (or storage) medium arrangement carrying and/or storing at least any one of the program products described herein and/or code executable by processing and/or control circuitry, the code causing the processing and/or control circuitry to perform and/or control at least any one of the methods described herein. A carrier medium arrangement may comprise one or more carrier media. Generally, a carrier medium may be accessible and/or readable and/or receivable by processing circuitry. Storing data and/or a program product and/or code may be seen as part of carrying data and/or a program product and/or code. A carrier medium generally may comprise a guiding/transporting medium and/or a storage medium. A guiding/transporting medium may be adapted to carry and/or carry and/or store signals, in particular electromagnetic signals and/or electrical signals and/or magnetic signals and/or optical signals. A carrier medium, in particular a guiding/transporting medium, may be adapted to guide such signals to carry them. A carrier medium, in particular a guiding/transporting medium, may comprise the electromagnetic field, e.g. radio waves or microwaves, and/or optically transmissive material, e.g. glass fiber, and/or cable. A storage medium may comprise at least one of a memory, which may be volatile or non-volatile, a buffer, a cache, an optical disc, magnetic memory, flash memory, etc. Code may generally comprise instructions.

An uplink direction may refer to a data transfer direction from a terminal to a network node, e.g., base station and/or relay station. A downlink direction may refer to a data transfer direction from a network node, e.g., base station and/or relay node, to a terminal. UL and DL may be associated to different frequency resources, e.g., carriers and/or spectral bands. A cell may comprise at least one uplink carrier and at least one downlink carrier, which may have different frequency bands. A network node, e.g., a base station or eNodeB, may be adapted to provide and/or define and/or control one or more cells, e.g., a PCell and/or a LA cell. Cellular DL operation and/or communication of a wireless device or UE may refer to receiving transmissions in DL, in particular in cellular operation and/or from a radio node/network node/gNB/base station. Cellular UL operation of a wireless device or UE may refer to UL transmissions, in particular in cellular operation, e.g. transmitting to a network or radio node/network node/gNB/base station.

Configuring (e.g., with or for a configuration) a device like a UE or terminal or radio node or network node may comprise bringing the device into a state in accordance with the configuration. A device may generally configure itself, e.g. by adapting a configuration. Configuring a terminal, e.g. by a network node, may comprise transmitting a configuration or configuration data indicating a configuration to the terminal, and/or instructing the terminal, e.g. via transmission of configuration data, to adapt the configuration configured. Configuration data may for example be represented by broadcast and/or multicast and/or unicast data, and/or comprise downlink control information, e.g. DCI according to 3GPP standardization. Scheduling may comprise allocating resource/s for uplink and/or downlink transmissions, and/or transmitting configuration or scheduling data indicative thereof.

In this disclosure, for purposes of explanation and not limitation, specific details are set forth (such as particular network functions, processes and signaling steps) in order to provide a thorough understanding of the technique presented herein. It will be apparent to one skilled in the art that the present concepts and aspects may be practiced in other variants and variants that depart from these specific details. For example, the concepts and variants are partially described in the context of Long Term Evolution (LTE) or LTE-Advanced (LTE-A) or LTE Evolution or NR mobile or wireless or cellular communications technologies; however, this does not rule out the use of the present concepts and aspects in connection with additional or alternative mobile communication technologies such as the Global System for Mobile Communications (GSM). While the following variants will partially be described with respect to certain Technical Specifications (TSs) of the Third Generation Partnership Project (3GPP), it will be appreciated that the present concepts and aspects could also be realized in connection with different Performance Management (PM) specifications.

Moreover, those skilled in the art will appreciate that the services, functions and steps explained herein may be implemented using software functioning in conjunction with a programmed microprocessor, or using an Application Specific Integrated Circuit (ASIC), a Digital Signal Processor (DSP), a Field Programmable Gate Array (FPGA) or general purpose computer. It will also be appreciated that while the variants described herein are elucidated in the context of methods and devices, the concepts and aspects presented herein may also be embodied in a program product as well as in a system comprising control circuitry, e.g. a computer processor and a memory coupled to the processor, wherein the memory is encoded with one or more programs or program products that execute the services, functions and steps disclosed herein.

It is believed that the advantages of the approaches, aspects and variants presented herein will be fully understood from the foregoing description, and it will be apparent that various changes may be made in the form, constructions and arrangement of the exemplary aspects thereof without departing from the scope of the concepts and aspects described herein or without sacrificing all of its advantageous effects. Because the aspects presented herein can be varied in many ways, it will be recognized that any scope of protection should be defined by the scope of the claims that follow without being limited by the description.

The invention claimed is:

1. A radio node for a wireless communication network, the radio node being configured for:
   pruning a predetermined number of elements from a Golay sequence, the Golay sequence having a total number of elements;
   zero-padding the total number of elements of the Golay sequence; and
   processing reference signaling based on a coding, the coding being based on the pruned Golay sequence and the zero-padded total number of elements.

2. The radio node according to claim 1, wherein the coding is based on a pair of complementary Golay sequences comprising a first sequence and a second sequence.

3. The radio node according to claim 1, wherein the coding maps first reference signaling to a first frequency range and a second reference signaling to a second frequency range.

4. The radio node according to claim 1, wherein elements of a Golay sequence are determined differentially.

5. The radio node according to claim 1, wherein reference signaling comprises at least one of primary synchronisation signaling and secondary synchronisation signaling.

6. A method for operating a radio node in a wireless communication network, the method comprising:
   pruning a predetermined number of elements from a Golay sequence, the Golay sequence having a total number of elements;
   zero-padding the total number of elements of the Golay sequence; and
   processing reference signaling based on a coding, the coding being based on the pruned Golay sequence and the zero-padded total number of elements.

7. The method according to claim 6, wherein the coding is based on a pair of complementary Golay sequences comprising a first sequence and a second sequence.

8. The method according to claim 6, wherein the coding maps first reference signaling to a first frequency range and a second reference signaling to a second frequency range.

9. The method according to claim 6, wherein elements of a Golay sequence are determined differentially.

10. The method according to claim 6, wherein reference signaling comprises at least one of primary synchronisation signaling and secondary synchronisation signaling.

11. A computer storage device storing executable instructions, when executed, the instructions causing processing circuitry to at least one of perform and control a method for operating a radio node in a wireless communication network, the method comprising:
    pruning a predetermined number of elements from a Golay sequence, the Golay sequence having a total number of elements;
    zero-padding the total number of elements of the Golay sequence; and
    processing reference signaling based on a coding, the coding being based on the pruned Golay sequence and the zero-padded total number of elements.

12. The radio node according to claim 2, wherein the coding maps first reference signaling to a first frequency range and a second reference signaling to a second frequency range.

13. The radio node according to claim 12, wherein elements of a Golay sequence are determined differentially.

14. The radio node according to claim 13, wherein reference signaling comprises at least one of primary synchronisation signaling and secondary synchronisation signaling.

15. The radio node according to claim 2, wherein elements of a Golay sequence are determined differentially.

16. The radio node according to claim 15, wherein reference signaling comprises at least one of primary synchronisation signaling and secondary synchronisation signaling.

17. The radio node according to claim 3, wherein elements of a Golay sequence are determined differentially.

18. The radio node according to claim 2, wherein reference signaling comprises at least one of primary synchronisation signaling and secondary synchronisation signaling.

19. The radio node according to claim 3, wherein reference signaling comprises at least one of primary synchronisation signaling and secondary synchronisation signaling.

20. The radio node according to claim 4, wherein reference signaling comprises at least one of primary synchronisation signaling and secondary synchronisation signaling.

\* \* \* \* \*